United States Patent
Almogy et al.

(10) Patent No.: US 7,842,930 B2
(45) Date of Patent: Nov. 30, 2010

(54) CHARGED PARTICLE DETECTOR ASSEMBLY, CHARGED PARTICLE BEAM APPARATUS AND METHOD FOR GENERATING AN IMAGE

(75) Inventors: Gilad Almogy, Kiriat Ono (IL); Dror Shemesh, Hod-Hasharon (IL); Pavel Adamec, Haar (DE)

(73) Assignee: ICT Integrated Circuit Testing Gesellschaft für Halbleiterpruftechnik mbH, Heimstetten (DE)

( * ) Notice: Subject to any disclaimer, the term of this patent is extended or adjusted under 35 U.S.C. 154(b) by 482 days.

(21) Appl. No.: 11/923,421

(22) Filed: Oct. 24, 2007

(65) Prior Publication Data
US 2008/0191134 A1    Aug. 14, 2008

(30) Foreign Application Priority Data
Oct. 25, 2006    (EP)    .................................. 06022328

(51) Int. Cl.
*H01J 37/28* (2006.01)
(52) U.S. Cl. ..................... 250/397; 250/310; 250/311
(58) Field of Classification Search ............... 250/397, 250/310, 311
See application file for complete search history.

(56) References Cited
U.S. PATENT DOCUMENTS

| | | | |
|---|---|---|---|
| 4,038,543 A | 7/1977 | Krisch et al. | |
| 4,099,055 A | 7/1978 | Todokoro | |
| 5,552,602 A | 9/1996 | Kakibayashi et al. | |
| 6,590,210 B1 * | 7/2003 | Essers | 850/9 |
| 2002/0172327 A1 | 11/2002 | De Groot | |
| 2004/0113075 A1 | 6/2004 | Naruse | |

FOREIGN PATENT DOCUMENTS

| | | |
|---|---|---|
| DE | 3925949 | 2/1991 |
| JP | 58018851 | 2/1983 |
| JP | 58155380 | 9/1983 |
| JP | 2006260957 | 9/2006 |

OTHER PUBLICATIONS

Extended European Search Report dated May 8, 2007.

* cited by examiner

*Primary Examiner*—Kiet T Nguyen
(74) *Attorney, Agent, or Firm*—Patterson & Sheridan, L.L.P.

(57) ABSTRACT

A charged particle detector assembly comprises a particle detector, which has at least one particle sensitive region for detecting at least a portion of the spatial distribution of charged particles and for generating a two-dimensional optical signal which correlates to the detected spatial distribution. Further, an image conduit has an input coupled to the particle sensitive region of the particle detector for transmitting the two-dimensional optical signal to at least one optical detector. Further, a selecting means is adapted for selecting at least a portion of the two-dimensional optical signal.

22 Claims, 5 Drawing Sheets

CHARGED PARTICLE DETECTOR ASSEMBLY, CHARGED PARTICLE BEAM APPARATUS AND METHOD FOR GENERATING AN IMAGE

CROSS-REFERENCE TO RELATED APPLICATIONS

This application claims priority to European Patent Application No. 06022328.6, filed Oct. 25, 2006, which is herein incorporated by reference.

DESCRIPTION

The invention relates to a particle detector assembly, in particular to a charged particle detector assembly. It further relates to a particle beam apparatus, more precisely to a charged particle beam apparatus. It further relates to a method for generating an image of a specimen, more specifically to a method for generating an image of a specimen by means of charged particles.

BACKGROUND OF THE INVENTION

Advanced science and technology such as nanotechnology, biology and semiconductor industry places a high demand on charged particle beam emitting devices such as electron microscopes or electron beam writing devices with respect to reliability and performance. For generating an image a focused primary charged particle beam is scanned over the specimen surface. The primary charged particles interact with the specimen and are either scattered or backscattered or generate secondary charged particles which originate from the specimen. For the purpose of this description any charged particles suitable for obtaining information about the specimen are referred to as charged signal particles. The charged signal particles are generated upon interaction of the primary charged particles with the specimen and therefore transmit information about the specimen. For example, charged signal particles are primary charged particles which are backscattered from or transmitted through and scattered by the specimen. Moreover, so-called secondary charged particles, which are generated upon interaction of the primary charged particles with the specimen, are also referred to as charged signal particles. In the case that electrons are used as charged particles, secondary charged particles are for instance known as secondary electrons. The charged signal particles are detected by appropriate particle detectors such as scintillators or the like to generate a detection signal. By synchronizing the detection signal with the scanning signal used to guide the primary charged particle beam over the specimen surface the detection signal can be used to generate an image of the specimen.

US 2004/0113075 describes for instance a transmission electron microscope which is capable of obtaining a high-resolution, wide field-of-view TEM image corresponding to the spatial resolution of the existing transmission electron microscope by using CCD TV cameras. The microscope includes four CCD cameras, for example, having their fiber tubes tilted. The use of CCD device is also described in U.S. Pat. No. 4,739,339, US 2002/0166963 and U.S. Pat. No. 4,149,074. Electron microscopes can also be used for obtaining diffraction images of crystals as for instance described in U.S. Pat. No. 5,557,104.

SUMMARY OF THE INVENTION

In view of the above there is provided in accordance with an aspect of the invention a charged particle detector assembly. The charged particle detector assembly comprises a particle detector, which has at least one particle sensitive region for detecting at least a portion of the spatial distribution of charged particles and for generating a two-dimensional optical signal which correlates to the detected spatial distribution. Further, an image conduit has an input coupled to the particle sensitive region of the particle detector for transmitting the two-dimensional optical signal to at least one optical detector. Further, a selecting means is adapted for selecting at least a portion of the two-dimensional optical signal.

In accordance with another aspect of the invention there is provided a charged particle beam apparatus which comprises chamber walls defining a vacuum chamber. The charged particle beam apparatus further comprises a charged particle source for generating a focused primary charged particle beam directed onto a specimen, the interaction of the primary charged particle beam with the specimen resulting in the generation of charged signal particles having a spatial distribution. The charged particle beam apparatus further comprises a scanning unit for scanning the focused primary charged particle beam over the specimen or at least a part of the specimen or the specimen surface, and a charged particle detector assembly, which corresponds to the above-described charged particle detector assembly.

In accordance with a further aspect of the invention, there is provided a method for generating an image by means of charged particles. The method comprises the steps of placing a specimen into a vacuum chamber; scanning a focused primary charged particle beam over a at least a portion of the specimen for generating charged signal particles having a spatial distribution; detecting at least a portion of the spatial distribution of the charged signal particles, the portion being preferably within a given solid angle or within a singly connected region; generating a two-dimensional optical signal, which correlates to the detected spatial distribution, by a particle detector; selecting a portion of the two-dimensional optical signal; detecting the selected portion by at least one optical detector; and generating an image of the specimen using the detected portion of the optical signal.

According to a further aspect, there is provided a charged particle detector assembly comprising a particle detector. The particle detector has at least one particle sensitive region for detecting at least a portion of the spatial distribution of charged particles and for generating a two-dimensional optical signal which correlates to the detected spatial distribution. The particle detector further has an image conduit having an input coupled to the particle sensitive region of the particle detector for transmitting the two-dimensional optical signal to at least a first and a second optical detector. The image conduit is adapted for splitting the two-dimensional optical signal into at least a first and a second optical sub-signal, e.g., such that each of the sub-signals carries a sub-portion of the information contained in the two-dimensional optical signal, and for transmitting each of two optical sub-signals to a corresponding one of the said optical detectors. Preferably, the image conduit comprises a plurality of optical fibers forming a single ordered bundle of optical fibers at one end for receiving the two-dimensional optical signal from the particle detector, and at least two separate ordered bundles of optical fibers at the other end for delivering each optical sub-signal to a respective optical detector. The splitting of the two-dimensional optical signal into sub-signals portions is to be understood in the sense that each of the sub-signals carries a spatial sub-portion of the information contained in the two-dimensional optical signal. Thus, the two-dimensional signal is segmented into the sub-signals.

According to yet a further aspect, there is provided a method for generating an image of a specimen by means of charged particles, the method comprising the steps of placing a specimen into a vacuum chamber; scanning a focused primary charged particle beam over a at least a portion of the specimen for generating charged signal particles having a spatial distribution; detecting at least a portion of the spatial distribution of the charged signal particles and generating a two-dimensional optical signal, which correlates to the detected spatial distribution, by a particle detector; splitting, preferably by an optical conduit, the two-dimensional optical signal into at least two optical sub-signals; transmitting, preferably by the optical conduit, each of the at least two optical sub-signals to a separate optical detector; detecting each of the optical sub-signals by the respective optical detector; and generating an image of the specimen using the detected signals.

BRIEF DESCRIPTION OF THE DRAWINGS

A full and enabling disclosure of the present invention, including the best mode thereof, to one of ordinary skills in the art, is set forth more particularly in the remainder of the specification, including reference to the accompanying figures. Therein.

DETAILED DESCRIPTION OF THE DRAWINGS

Figure 1:
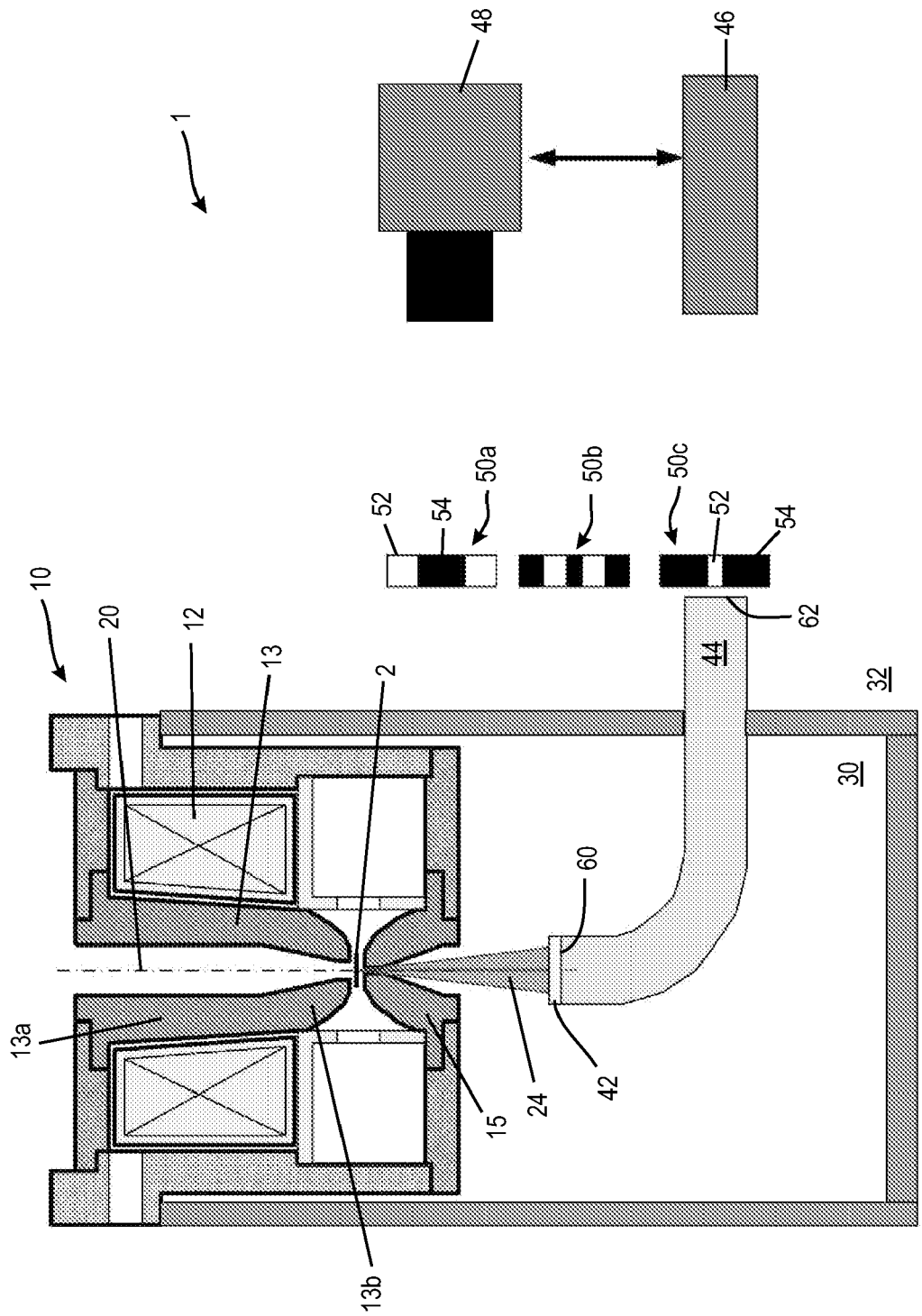
FIG. 1 shows a scanning transmission electron microscope (STEM) comprising a plurality of selection apertures for selecting portions of the transmitted optical signal.

In the remainder of the description the invention is described in connection with scanning electron microscopes. The invention, however, is not restricted thereto and a skilled person will appreciate that the invention is also applicable to other charged particles detector assemblies and apparatuses employing other charged particles such as ions. Further, scanning electron microscopes employ primary electrons as primary charged particles. The generated signal electrons therefore correspond to the charged signal particles.

Accelerated charged particles allow for example the imaging of the surface of specimens at high resolution and the local analysis of the composition of the specimen. For instance, in a scanning electron microscope the primary electron beam is scanned over the specimen surface. At each point of incidence, i.e., the point where the primary electrons interact with the specimen surface, signal electrons are generated. The term "signal electrons" is used here for electrons carrying information about the specimen under observation. Signal electrons can be for instance backscattered primary electrons or primary electrons transmitting the specimen. The transmitted primary electrons can also be scattered when transmitting the specimen. Moreover, secondary electrons can be generated when primary electrons interact with the specimen. The secondary electrons also form signal electrons carrying information about the specimen.

The spatial resolution obtainable with electrons strongly depends on the energy of the electrons. Further, monochromatic electrons, i.e., electrons having substantially the same energy, are preferably used for scanning a specimen. This is also advantageous for obtaining a small focusing spot. Typically, the primary electrons are generated by a special electron source arranged within a chamber which is adapted to maintain a very high or ultra high vacuum. The specimen is also arranged within the vacuum chamber. A skilled person will appreciate that other components are also arranged in the vacuum chamber such as a scanning unit adapted to scan a focused beam of primary electrons over the specimen surface and an objective lens. Monochromatic or substantially monochromatic electrons are for instance selected by suitable diaphragms arranged along the optical axes of the scanning microscope.

For obtaining an image of the specimen surface, the signal electrons are detected. Signal electrons emanate from the specimen under various starting angles and energies and are therefore emitted from the specimen with a spatial distribution. The spatial distribution of the signal electrons strongly depends on their kind (e.g., backscattered/transmitted primary electrons, secondary electrons). For instance, backscattered primary electrons typically have a high energy and are reflected from the specimen surface with a wide angular distribution. Therefore, a wide spatial distribution of the backscattered electrons is observed. Moreover, the particular angular or spatial distribution of the electrons may be specific for the substrate material at the beam spot location. For instance, in the case of a crystal it may contain information regarding the crystal structure and orientation and about the lattice constant. On the other hand, secondary electrons typically have a lower energy than backscattered primary electrons and are emitted from the specimen surface with a rather sharply peaked or concentrated spatial distribution. Moreover, transmitted primary electrons are only slightly deflected or scattered and therefore exhibit a rather sharply peaked spatial distribution as well.

The signal electrons are detected by a particle detector. The particle detector may comprise e.g., a scintillator material as a particle sensitive region which generates light pulses upon interaction with the signal electrons. The particle sensitive region can be for instance formed as a plate, preferably a solid plate, of rectangular or circular shape. The spatial distribution of the generated light pulses substantially correlates to the spatial distribution of the signal electrons interacting with the particle sensitive region. In particular, the two-dimensional distribution of the generated light pulses substantially correlates to the spatial distribution of the signal electrons which interact with the particle sensitive region in a cross-sectional area within the particle sensitive region. Hence, a two-dimensional optical signal is generated by the particle sensitive region of the of the particle detector. The spatial distribution of the optical signal therefore correlates to the spatial distribution of the signal electrons. The particle sensitive region of the particle detector can be arranged coaxially or off-axis with respect to a main optical axis of the charged particle beam apparatus.

It goes without saying that for obtaining the complete spatial distribution a particle sensitive region forming a sphere would be required. However, as the spatial distribution of the signal electrons typically has a pronounced directional characteristic within a given solid angle it is sufficient to provide a particle sensitive region which substantially covers this solid angle. For example, the signal electrons can be emitted into a single main emitting direction with a spatial distribution within a given region around this main direction.

Preferably, the particle sensitive region essentially is or defines a singly connected region in a mathematical sense. For the purpose of the invention, this means that any path connecting two points and lying within the region defined by the particle sensitive region can be continuously transformed into any other such path. In other words, the region defined by the particle sensitive region doesn't have any holes. Alternatively, the particle sensitive region is arranged in such a way that the spatial distribution of the particles can essentially be detected within the entire region that is surrounded by an outer boundary of the particle sensitive region. Alternatively, the particle sensitive region essentially extends within or fills its outer boundary. The particle sensitive region essentially covers a solid angle. The particle sensitive region itself may not be singly connected in a strict sense, e.g., if it deviates from a strict mathematical definition in unessential aspects. Such unessential aspects could be, for example, boundaries between more than one scintillating plate and other aspects that do not have in themselves any relevance for the working principle of the apparatus.

An input of an image conduit is connected with the particle sensitive region of the particle detector so that the light pulses are coupled into the image conduit. The image conduit is a means for transferring the image from an input portion to an output portion. The image conduit is capable of transmitting the two-dimensional optical signal or image to an optical detector. For this purpose, an ordered optical fiber bundle or an optical rod is for instance used. An ordered optical fiber bundle comprises a plurality of individual optical fibers which are arranged in an ordered manner to enable transmission of a two-dimensional signal without destructing the two-dimensional information. An optical fiber rod is typically formed of a plurality of ordered individual optical fibers which are embedded in a glass or polymer matrix to give mechanical stability.

By using a selecting means, one or more portions of the two-dimensional signal can be selected for detection. Selecting of a portion of the two-dimensional optical signal is to be understood in the sense that an information portion or a range of the signal is selected. Thus, the selected portion of the two-dimensional optical signal carries a portion of the information contained in the two-dimensional optical signal. For example, the selected signal can include a (spatial) range or a (two-dimensional) sub-range of the two-dimensional optical signal. Selecting refers e.g., to selecting spatially different portions of the two-dimensional optical signal. In view of the above, the selecting means does not include e.g., an aperture defined by a lens arranged outside an imaging plane, because the aperture merely reduces the light intensity without selecting an information portion. The signal selection can also be used in the sense of a splitting of the two-dimensional optical signal into at least a first and a second signal portion, the first and the second signal portion being selected portions, e.g., spatially different portions of the two-dimensional optical signal. Then, the selecting or splitting of the two-dimensional optical signal into sub-signals or (sub-)portions is to be understood in the sense that each of the sub-signals or (sub-)portions carries a sub-portion of the information contained in the two-dimensional optical signal.

The selecting means is preferably arranged between an output of the image conduit and the optical detector, or between the image conduit and the at least one optical detector. Alternatively, the selection means may be integrally comprised in the image conduit. In other words, the selection means may be part of the image conduit. Preferably, the selecting means is a variable selecting means for variably selecting portions of the two-dimensional optical signal. Thereby, signals of different "areas" of the two-dimensional signal can be used for further processing such as generation of an image of the specimen. The selecting means may allow a selection of any portion of the two-dimensional optical signal. In particular, it can be used for selecting at least one outer portion of the two-dimensional optical signal.

The selecting means also allows the simultaneous use of two or more separate areas or portions of the two-dimensional signal for gathering information about the specimen. Hence, the selecting means is adapted for selecting at least two sub-signals from the two-dimensional optical signal, i.e., for segmenting the two-dimensional optical signal into one or more part-signals or sub-signals, such that each of the sub-signals carries a sub-portion of the information contained in the two-dimensional optical signal. For example, for signal electrons having a spatial distribution around a main emitting direction, segments of circles or concentric rings can be selected as part-signals for detecting. The image conduit can then be adapted for transmitting each of the sub-signals to a respective separate optical detector.

The variable selection of portions of the two-dimensional optical signal allows tailoring of the detection to meet specific demands. The selected part-signal of the two-dimensional optical signal is detected by the optical detector. It is also conceivable that two or more detectors are provided for simultaneously detecting different part-signals which correspond to different areas of the two-dimensional optical signal. Suitable selecting means are for example exchangeable apertures disposed between the output of the image conduit and the optical detector, and a plate having a plurality of optical elements with individually controllable transparency. For the latter one liquid crystal plates having a plurality of individually addressable cells are for instance used. Typically, the selecting means comprises transmissive areas and non-transmissive areas and is located within an imaging plane or region or within a near-field region in the signal path.

Alternatively, the selecting means can be arranged to have a fixed selection. For example, the image conduit can be formed to have a single input coupled to the particle sensitive region and two or more outputs coupled to different optical detectors. Those image conduits are for instance known as bifurcated optical fiber bundles in case of two outputs. As a fiber bundle or a fiber rod comprises a plurality of ordered optical fibers, the segmentation of the two-dimensional optical signal is defined by the allocation of each optical fiber to a respective output.

Typically, the input and output of the image conduit has a circular or rectangular shape. However, other shapes are also conceivable.

The image conduit transmits the two-dimensional optical signal, which is also referred to as the image of the spatial distribution of the signal electrons, from the vacuum chamber to an exterior thereof. The selecting means and the optical detector can therefore be arranged outside of the vacuum chamber, which facilitates exchange of detectors and selecting means, and allows a reduction of the size of the vacuum chamber.

The optical detector can be, for example, a photomultiplier or a CCD camera. In the latter case, the selection means can be implemented by means of a software or firmware for selecting a predetermined selection of the image pixels recorded by the CCD camera for further processing and for discarding the remaining image pixels.

The particle detector can be arranged behind the specimen with respect to a main propagation direction of the primary electrons. In this case, the transmitted primary electrons form the signal electrons and a transmission image of the specimen can be generated from the detected signal electrons. Preferably, the particle sensitive region of the particle detector is coaxially arranged with respect to the main optical axis of the scanning electron microscope. Alternatively, the particle detector can also be arranged in front of the specimen with respect to a main propagation direction of the primary electrons. In particular, the objective lens of the scanning electron microscope can be arranged between the particle detector and the specimen to accelerate the signal electrons toward the particle detector. This also results in a partial focusing or concentration of the signal electrons. Hence, the spatial distribution of the signal electrons becomes more pronounced or peaked. In any case the particle sensitive region of the particle detector can also be arranged off-axis with respect to the main optical axis.

An image of the specimen can be produced by scanning the focused primary electron beam over the specimen or the specimen surface. Thus, signal electrons are successively generated from different locations on the specimen, whereby their energy, initial momentum, intensity and/or other detectable characteristics are correlated to specimen properties at the respective location. Thus, the signal detected by the detector assembly is correlated to these properties, such as surface height or inclination, surface material, crystal properties, etc. Thus, by scanning the beam over the specimen, a spatial image of these properties is generated.

Subsequently, concrete embodiments will be described in connection with the accompanying figures. In these embodiments, the charged particle beam emitting device and the charged particle beam apparatus are mainly described in connection with scanning electron microscopes. However, those skilled in the art will appreciate that the present invention is not restricted thereto but also includes, for example, ion beam apparatuses.

FIG. 1 shows an electron beam apparatus 1 such as a scanning transmission-type electron microscope. The electron beam apparatus comprises an electron beam emitting device (not shown) and a portion of an electron beam column for guiding the electron beam along an optical axis 20. The electron beam column comprises beam manipulation means known by the skilled person, such as beam acceleration and/or deceleration means, an objective lens system, a beam deflection system etc. In FIG. 1 the objective lens or focusing lens 10 is a magnetic lens comprising a coil 12 for generating a magnetic filed, and pole pieces 13, 15 for appropriately shaping the generated magnetic filed. The pole pieces 13 comprises an upper portion 13a, which defines a substantially cylindrical inner space or column, and a lower portion 13b, which defines a conical inner space or column. A beam deflection system comprising deflection electrodes may be integrated into the upper portion 13 a of pole pieces 13 for scanning the beam over a specimen 2 is shown. Advantageously, the electron beam apparatus 1 is able to focus the electron beam such that its diameter is smaller than 1 nm, particularly about 0.2 nm, for scanning transmission electron microscopy (STEM) and smaller than 5 nm, particularly about 3 to 4 nm, for scanning electron microscopy (SEM).

The beam deflection system allows scanning of the electron beam over at least a portion of the specimen. When the electron beam strikes the specimen, signal electrons 24 emanate from the spot of the specimen hit by the primary electron beam. The signal electrons can be e.g., scattered electrons or secondary electrons. The signal electrons leave the spot of the specimen 2 with a given intensity and energy or momentum or velocity distribution, which contain information regarding specimen properties at the spot region from which the signal electrons emanate.

In particular, the total intensity and the angular velocity distribution of the signal electrons 24 contain such information. For example, a narrowly peaked angular velocity distribution around the optical axis may indicate primary electrons, whereas a broader angular velocity distribution may indicate secondary electrons. Further, the presence of diffraction peaks may be a signature of a crystalline structure and may, further, contain information regarding crystal type, orientation of crystal axes or the crystal lattice constant.

Some of the signal electrons 24 follow a trajectory which enters an electron detection region 42 of a particle detector, e.g., a scintillator. Typically, the particle detector has a particle sensitive solid plate forming the electron detection region or particle sensitive region 42. The spatial distribution of the signal electrons in the detection region 42 is correlated to their initial angular velocity distribution, since they follow an essentially straight trajectory. In other embodiments, the spatial distribution of the signal electrons in the detection region 42 may be correlated to other properties of the signal electrons as well. For example, in the embodiment shown in FIG. 4 (discussed in more detail below) the signal electrons are deflected by a deflector 41. In this case, their spatial distribution at the detection region 42 can be correlated, in addition to the angular velocity, with the kinetic energy as well, since the deflection typically depends on the electron kinetic energy. The embodiment shown in FIG. 1 can also be equipped with a deflection unit analogous to the one shown in FIG. 4 or with some other selective filtering or dispersive or deflecting elements, e.g., in order to separate low-energy electrons from high-energy electrons.

In the detection region 42, a two-dimensional optical signal is generated, which is correlated to the detected spatial distribution, i.e., which contains information regarding the spatial distribution of the detected electrons. Consequently, the signal is correlated to the spatial distribution of the electrons. In the case of the detection region 42 being a scintillator, light is emitted when the scintillator is struck by a signal electron. Thus, the amount or the distribution of emitted light are respectively correlated to the amount or the distribution of the signal electrons 24 in the detector region. Hereby, only the distribution in a cross-sectional plane, namely in the plane perpendicular to the trajectories of the signal electrons 24 is of relevance. Hence, the optical signal is two-dimensional, i.e., the relevant information of the optical signal is contained in a two-dimensional signal distribution (namely, in the plane perpendicular to the trajectories of the signal electrons), even if the electron sensitive region is three-dimensional.

The scintillator may be made of crystalline material (e.g., phosphor), of plastic, of fluorescent organic liquid or of other suitable material. Instead of a scintillator, another particle detector known in the art may be used, e.g., a Cherenkov detector.

There is further provided an image conduit 44. The image conduit 44 has an input 60, which is coupled to the detection region 42, such that at least a portion of the optical signal from the detection region is input into the image conduit 44. The input of the image conduit is for instance glued to the detector by suitable optical glue. The detection region 42 is thus arranged in a near-field region of the image conduit. Because the optical signal is generated in a near-field region of the image conduit, a disturbance of the two-dimensional optical signal at the input 60 of the image conduit is minimized; information regarding the two-dimensional signal distribution is input to the image conduit. Alternatively, a lens may be placed between the detection region and the input (not shown).

The image conduit 44 is able to transmit the optical signal to an output side 62 of the image conduit. It is advantageous to keep a disturbance of the signal as small as possible during transmission through the image conduit. In any case, the transmitted image or optical signal corresponds to and carries information of the optical signal generated by the detection region 42. If the image conduit is a fiber bundle, its spatial resolution is determined by the number and/or the spatial density of the optical fibers within the fiber bundle. In any case, it is advantageous that the spatial resolution is sufficiently high for resolving the relevant information contained in the two-dimensional optical signal, e.g., diffraction patterns or information for generating a bright field or dark field image contrast etc.

The image conduit is a conduit for transferring an image or a two-dimensional optical signal from an input to an output. Thus, the image conduit provides an input imaging plane 60 or two-dimensional region or the like, at which the optical signal is input, and an output imaging plane 62 or two-dimensional region or the like, at which the optical signal is output. Preferably, it provides channels for transferring sub-portions of the two-dimensional optical signal. Thus, a vision panel or transparent plate does by itself not provide an image conduit.

The entire electron beam column is operated under high or ultra-high vacuum conditions. Reference number 30 designates the vacuum region of the electron beam column. Independently of the shown embodiment, the image conduit 44 transmits the optical signal from the vacuum region 30 to a non-vacuum region 32. Thus, further signal manipulations and/or detections do not have to take place under vacuum conditions.

The transmitted optical signal can be detected by an optical detector 46, e.g., a photomultiplier. The photomultiplier basically measures the total optical signal intensity. Instead of a photomultiplier, a photodiode or some other optical detector can be used. However, photomultipliers have an excellent light sensitivity.

Placed between the image conduit 44 and the optical detector 46 is a selection screen 50c. The selection screen contains at least one transmissive region 52, indicated as white region and also called selection aperture, and at least one non-transmissive region 54. The selection screen 50c allows the two-dimensional optical signal, or image, to be transmitted selectively from the output of the image conduit 44 to the optical detector 46. In other words, it allows selecting portions or sub-information, while remaining portions or information are discarded. Namely, the optical signal is transmitted only through the transmissive regions 52, while portions of the optical signal that enter the non-transmissive regions 54 do not reach the detector 46. The effect of the selection screen 50c can also be described as weighting the optical signal by a two-dimensional weighting function. Approximately, the weighting function is equal to 1 in part of the optical signal corresponding to the transmissive region(s) 52 and is equal to 0 in the part corresponding to the non-transmissive region(s) 54. It is also possible to provide partially transmissive regions in the selection screen. Then, a continuous weighting function can be realized.

The selection screen is adapted for selecting and thereby discriminating signals that are correlated to substrate properties. Thus, an image contrast is obtained. For example, the selection screen 50c has a non-transmissive region for blocking the optical signal from electrons that are deflected away from the optical axis by an angle of, for instance, more than 10 mrad or, preferably, more than 1 mrad, so that only non-scattered primary electrons are detected. Correspondingly, the selected signal is mainly due to primary electrons that are not or only slightly deflected away from the optical axis. Hence, a bright field image is acquired.

The selection screen 50b, in contrast, mainly blocks the signal generated by the undeflected electrons and selects a signal generated by electrons that are deflected from the main optical axis by a certain angle. Preferably, the signal generated by electrons deflected by an angle between 10-30 mrad is selected. Thereby, a dark field image or annular dark field image is acquired. A high-angular dark field image is acquired by the selection screen 50a, in which the signal generated by electrons deflected by a high angle, e.g., greater than 30 mrad, is selected. The values given above with respect to the deflection angle may depend on the acceleration voltage of the beam column.

The deflection of the electrons, which allows obtaining the image contrast, can be incoherent. The deflection can also be due to coherent diffraction from the crystal lattice. In this case, it is advantageous to provide a selection screen having a pattern of transmissive and non-transmissive regions. The pattern has a sufficiently high spatial resolution for discriminating the diffraction pattern. The shown selection elements 50a to 50c are of axially symmetrical shape. However, it is also possible to provide non-axial symmetric selection elements, e.g., in order to detect substrate anisotropies or to produce an image from electrons deflected by a particular crystal plane. For example, a given quadrant of the image can be made non-transmissive. It is also possible to deflect the primary beam 22 or to tilt or displace the particle detector 42, e.g., in order to detect substrate anisotropies or to modify the image acquiring process or parameters thereof.

The selection screen 50c is held by a screen holder (not shown). The screen holder allows the selection screen 50c to be replaced by another selection screen e.g., selected from the selection screens 50a and 50b shown in FIG. 1. Thereby, portions of the two-dimensional optical signal can be variably selected, preferably without vacuum access.

As is indicated in FIG. 1, a CCD camera 48 may be used instead of the photomultiplier 46 as an optical detector. In this case, not only the integrated intensity of the incident optical signal is measured, but also the two-dimensional spatial distribution of the signal can be measured. Thus, e.g., a diffraction pattern of the electrons, which arises due to their scattering off a crystalline specimen portion, can be recorded. However, the full image information recorded by the CCD chip is not always needed. For example, if a scanning image of the sample 2 is to be generated, the full information from the CCD camera is usually condensed into one- or few-pixel information, i.e., into a color or greyscale value.

For this purpose, the CCD camera 48 is typically connected to an image processing device, which is equipped to extract the condensed information from the recorded image. For this purpose, it is possible to implement an algorithm in the image processing device that yields similar results as the selection screen described above. Namely, the image processing device can be programmed to select only a portion of the signal captured by the CCD camera, and to discard the remaining portion. For example, the image processing device can be programmed to discard the part of the captured image that corresponds to the non-transmissive portion 54 of one of the selection screens 50a to 50c. This way, subsequent image processing can be simplified and/or accelerated. The subsequent image processing can be, for example, to sum over the remaining captured pixel intensities in order to obtain the total intensity of the remaining image.

The image conduit 44 is adapted for transmitting the two-dimensional optical signal distribution from the vacuum portion 30 of the apparatus to the non-vacuum portion. Thereby, the user can be enabled to vary the selection means, or to manipulate or access the optical signal in any other way, without need for accessing the vacuum portion 30.

In the scanning transmission electron microscope (STEM) of FIG. 1, the focused primary beam is scanned over the specimen. For each location of the focused primary beam, the signal electrons, which are generated by the primary beam interacting with the specimen, are detected by the particle detector assembly. Thereby, for each location of the specimen hit by the focused beam image information, e.g., a pixel value, is generated that relates to properties of the specimen at this location. Thus, by scanning the electron beam over the specimen 2, an entire image of the specimen, i.e., of a cross-section of the specimen, is generated.

Figure 2:
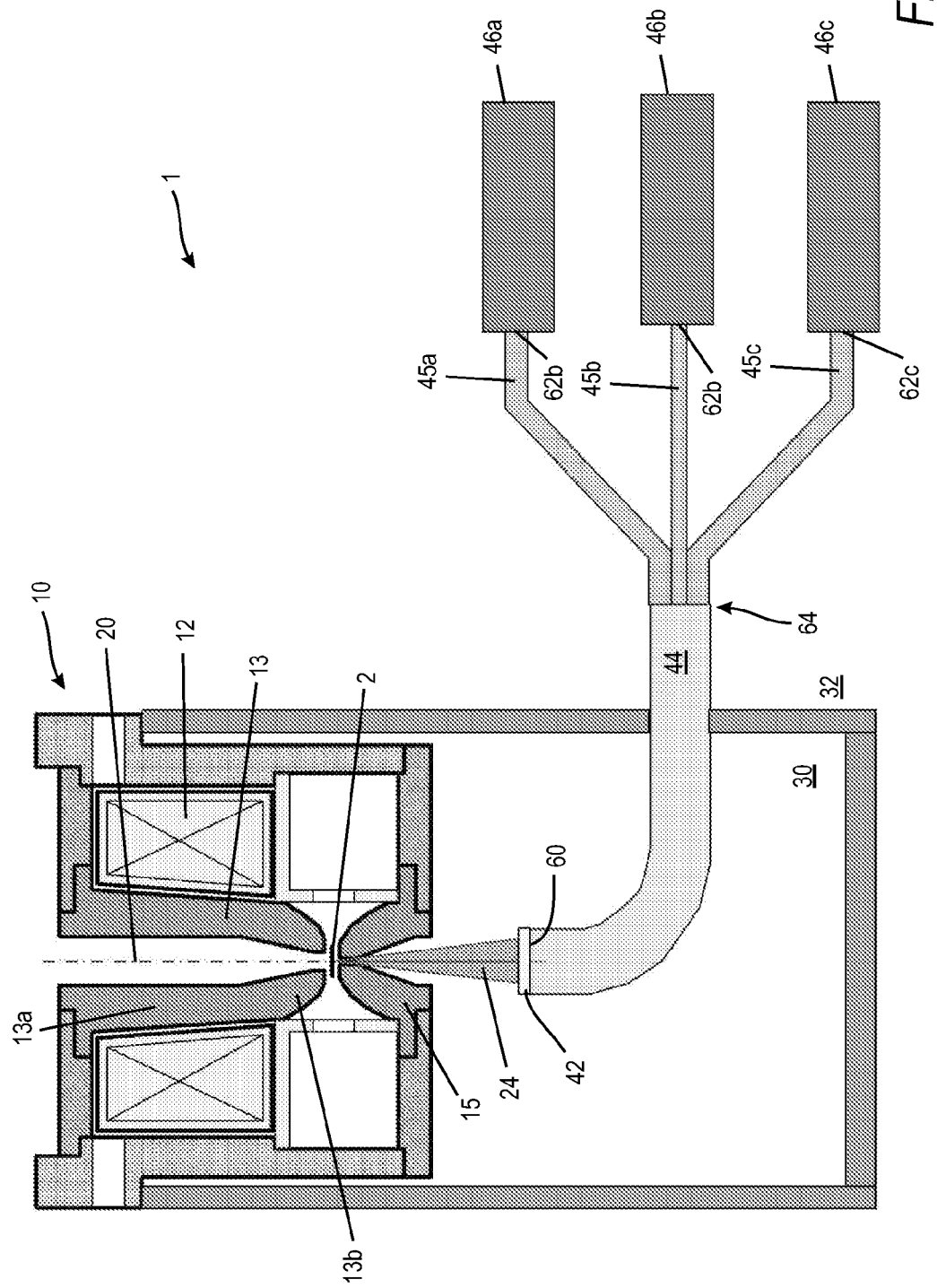
FIG. 2 shows another embodiment of a STEM comprising a forked optical conduit for splitting the optical signal into separate optical detection channels.

An alternative embodiment of an electron beam apparatus is shown in FIG. 2. Herein, the beam column is analogous to the beam column shown in FIG. 1, and like reference numbers refer to like parts of the apparatus. The apparatus further comprises an electron detector assembly comprising a particle detector 42 corresponding to that of FIG. 1. The apparatus further comprises an image conduit 44, such as an optical rod. The image conduit 44 has an input portion 60 coupled to the particle detector 42 for receiving a two-dimensional optical signal. The image conduit is adapted for splitting the received two-dimensional optical signal into three optical sub-signals. Each of the sub-signals carries a sub-portion of the information contained in the two-dimensional optical signal. Each of the sub-signals is fed into a separate partial image conduit, which is coupled to a respective detector element. Thus, the image conduit is arranged to receive a two-dimensional optical signal, to split the received signal into sub-signals, and to transmit the sub-signals to respective optical detectors 46. Each of the sub-signals corresponds to a selected portion of the optical signal, i.e., carries a respective portion of the signal.

In the embodiment shown in FIG. 2, the image conduit is an optical rod comprising a plurality of optical fibers. Each of the optical fibers is able to transmit essentially an image pixel or a sub-information of the two-dimensional optical signal. The plurality of optical fibers transmits the two-dimensional optical signal in its entirety. On one end 60 of the image conduit 44, namely on the particle detector 42 end, a single bundle of the optical fibers is provided. At the other end of the image conduit 44, namely on the optical detector 46 end, three separate sub-bundles 45a, 45b and 45c of optical fibers are provided. Each of the sub-bundles comprises a subset of the optical fibers corresponding to a separate image region. Thus, each of the sub-bundles corresponds to a separate portion of the optical signal. Each of the outputs 60a, 60b, and 60c of the separate sub-bundles 45 am 45b and 45c are connected to respective optical detectors 56a, 46b and 46c.

The sub-bundles may be chosen for selecting or segmenting the image in any suitable way for generating an image contrast. For example, each of the sub-bundles can be chosen such that the associated image portion (i.e., the image portion transmitted by the sub-bundle) corresponds to a respective portion of one of the selection screens 50a, 50b or 50c shown in FIG. 1. For example, the associated image portion can correspond to a particular transparent portion 52 or to a particular non-transparent portion 54 of one of the selection screens 50a, 50b or 50c shown in FIG. 1. In one specific example, the associated image portions of the three sub-bundles shown in FIG. 2 correspond to the following parts of the selection screen 50b of FIG. 1: the image portion associated to the first sub-bundle 45a corresponds to the non-transmissive central part; the image portion associated to the second sub-bundle 45b corresponds to the transmissive part; and the image portion associated to the third sub-bundle 45c corresponds to the non-transmissive outer part. Other selections can be obtained by modifying e.g., the number of sub-rods, and/or by varying the image portion associated to each sub-rod. In particular, an embodiment for selecting two sub-signals, i.e., for segmenting the two-dimensional optical signal into two sub-signals, is possible. This embodiment has two sub-rods and correspondingly two optical detectors 46. Herein, the image portion associated to the first sub-rod can correspond e.g., to the transmissive portion 52, and the image portion associated to the second sub-rod can correspond e.g., to the non-transmissive portion 54 of one of the splitting screens 50a, 50b, 50c of FIG. 1, respectively.

In the above-described embodiment of FIG. 2, the partial conduits 45a, 45b and 45c are integrally provided in the image conduit 44, i.e., the same optical fibers extend through the image conduit and the partial conduits. In an alternative embodiment, the image conduit 44 and the partial conduits 45a, 45b and 45c are separate conduits, e.g., each comprises a separate set of optical fibers. In the alternative embodiment, there is provided an interface 64 between the image conduit 44 and the partial conduits, which is arranged for transferring a respecting portion of the two-dimensional optical signal from the image conduit 44 to the respective partial conduit 45a, 45b or 45c. For example, in the case of fiber bundles the interface couples each fiber of the image conduit 44 with a respective partial conduit. Preferably, the interface of the second embodiment is placed outside the vacuum region, and the interface and/or the partial conduits 45 can be replaced by a user. Thereby, portions of the two-dimensional optical signal can be variably selected.

The sub-rods are adapted for transmitting the sub-signals of the two-dimensional optical signal to a respective optical detector 46, e.g., a photomultiplier. The optical detectors 46 are adapted to detect the optical sub-signal. The detector signals are fed into a signal processing device, which can generate e.g., image pixel values or other information from these signals. In analogy to the previous embodiment, the image pixel values can be used for generating an image of the specimen.

Figure 3:
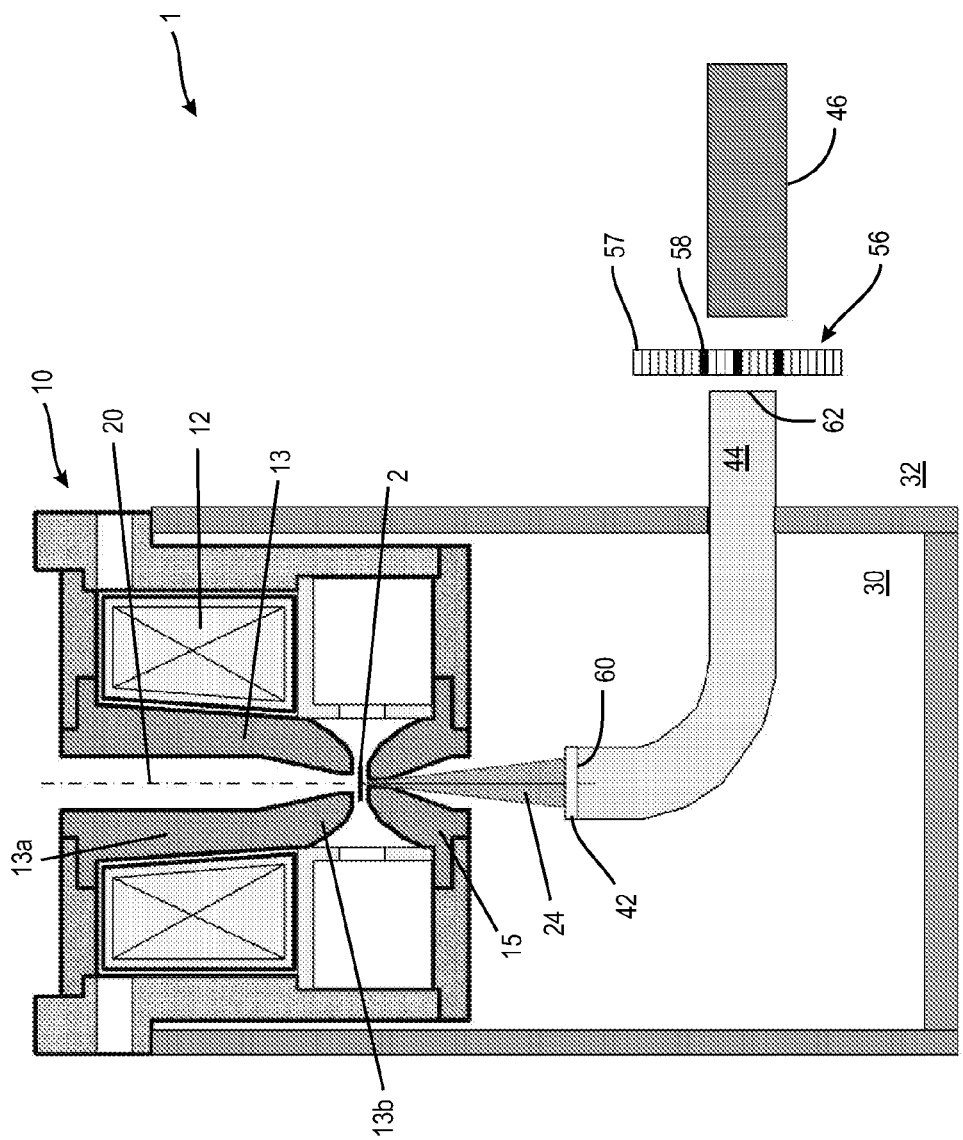
FIG. 3 shows a further embodiment of a STEM with an addressable plate as a selection means.

An alternative embodiment is shown in FIG. 3. This embodiment is essentially analogous to the embodiment shown in FIG. 1, and like reference numbers refer to like parts of the apparatus. A difference with respect to the embodiment of FIG. 1 is that the selection screen 50 is replaced by a variably selection screen, namely by an addressable plate 56.

The addressable plate 56 is a plate with addressable portions having individually controllable transparency. For example, a LCD display can be used as an addressable plate. Then, each of the pixels of the LCD screen can be addressed to be either a transparent pixel or portion 57 or a non-transparent pixel or portion 58. Further, a pixel can optionally also be addressed to be a partially transparent pixel, such that a smooth transition between transparent and non-transparent portions of the addressable plate can be obtained.

By using the addressable plate, portions of the two-dimensional optical signal can be variably selected. The selection is analogous to the selection by the selection screen of FIG. 1. In FIG. 3, the selection can be varied without manual intervention.

Figure 4:
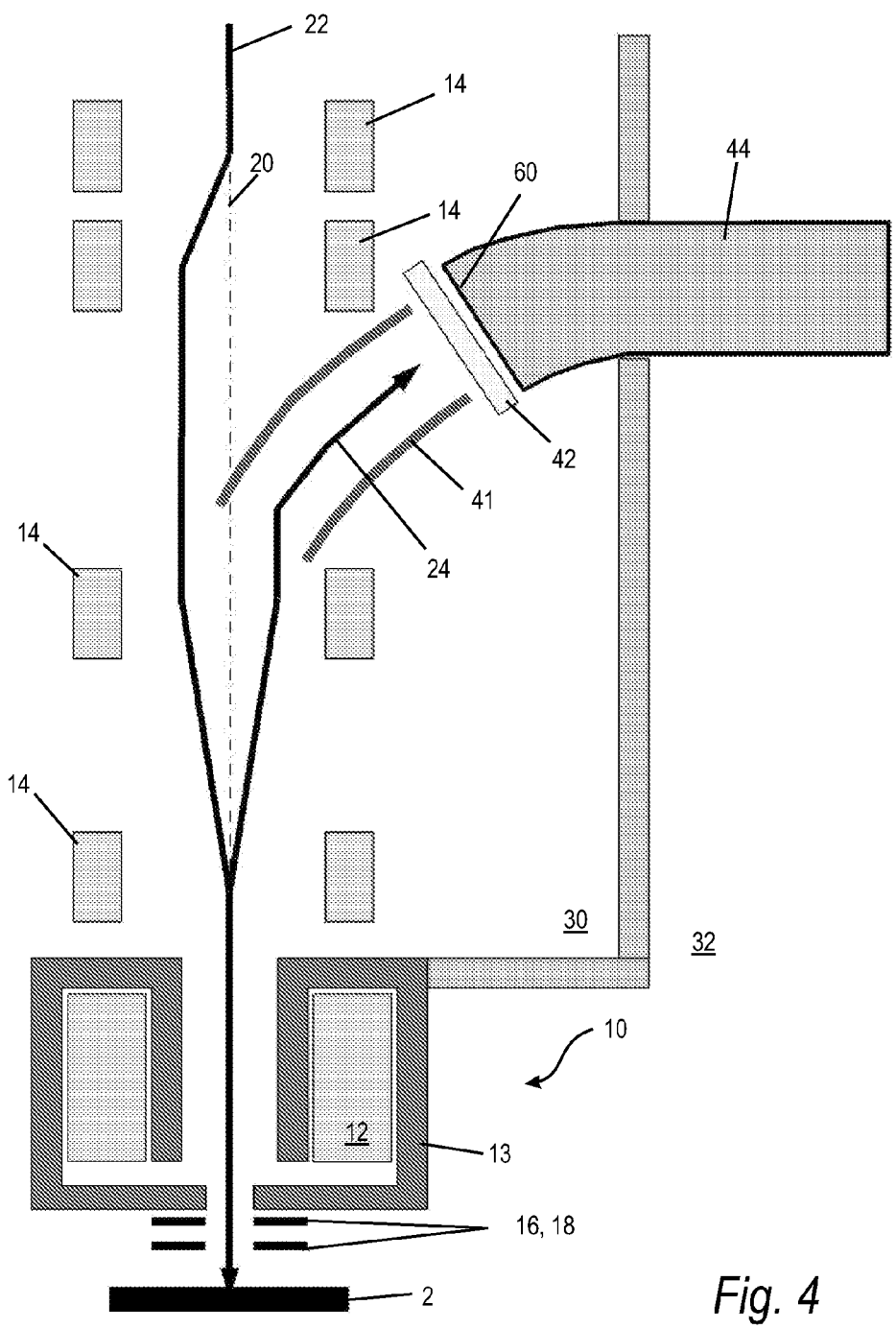
FIG. 4 shows a scanning electron microscope (SEM) having an optical conduit.

FIG. 4 shows a scanning electron microscope (SEM). In analogy to the embodiments of FIG. 1-3, there is shown a beam column defining an optical axis 20. The beam column is evacuated (vacuum 30). During operation of the beam column, a primary electron beam 22 is directed onto a specimen 2. A beam deflection system 14 deflects the electron beam, which initially propagates along the optical axis, such that it is first deflected away from the optical axis and then deflected back onto the optical axis. The beam deflection system 14 is typically formed using magnets, preferably electromagnets, which exert a Lorentz force upon the electron beam. Alternatively, an electrostatic deflection system employing electrodes can be used for deflecting and scanning the primary electrons. There is further provided an objective lens system for focusing the beam comprising a coil 12, 13 for generating a magnetic field and an electrostatic element comprising electrodes 16, 18 for decelerating the primary electrons and for accelerating the signal (secondary) electrons.

In the scanning electron microscope, signal electrons are detected which are reflected or which emanate from the specimen 2 on the primary beam side of specimen 2. FIG. 4 shows reflected signal electrons 24 which emanate form specimen 2 essentially along the optical axis. The deflection system 14 influences the signal electrons 24 differently (namely, in FIG. 4, essentially oppositely) than the primary electrons 22, since the signal electrons 24 travel in a different (namely, an essentially opposite) direction. Thus, the deflection means 14 exert a different Lorentz force on the signal electrons than they exert on the primary electrons. Consequently, the signal electrons 24 are spatially separated from the primary electrons 22.

A similar effect can be achieved if electrostatic deflection means are used instead of the magnetic deflection means. Here, the signal electrons receive a deflection that is different from that of the primary electrons due to their different kinetic energy.

There is further provided a deflector 41 for deflecting the signal electrons toward the particle detector or scintillator 42. Besides separating the beam of signal electrons 24 from the primary electrons, the deflector 41 can influence it in further respects as well. Firstly, the deflector 41 may be an electrostatic deflector. At least in the regime of low kinetic energy electrons, the deflection effect of the deflector can somewhat depend on the kinetic energy of the electron. Thus, the deflector can lead to an energy separation or energy discrimination of the electron. Consequently, the image generated by the SEM can be correlated to its kinetic energy distribution. Further, the distribution of the electrons can be somewhat narrowed, or focused, such that the cross-section of the detector 42 allows detecting a distribution in a wide area, which would otherwise surpass the detector volume. The other embodiments shown e.g., in FIG. 1 to 3 can also be equipped with a deflector similar to the one shown in FIG. 4.

In analogy to FIGS. 1 to 3, a two-dimensional optical signal is generated by the particle detector 42 and is fed into the image conduit 44. The image conduit 44 and the further devices coupled to it are provided in correspondence to the embodiments of FIGS. 1 to 3.

In a variation of the embodiment of FIG. 4, the specimen can be arranged such that its surface is not perpendicular to the optical axis. In this case the reflected signal electrons emanate at an angle with respect to the optical axis 22 and therefore follow a beam path that is different from the path of the primary beam 22 even without the beam being deflected by the deflection system 14. In this variant, the beam deflection system 14 is not necessary. However, in this variant the elements should be arranged such that there is a beam path for the signal electrons 24 to travel from the specimen 2 to the detector 42.

Figure 5:
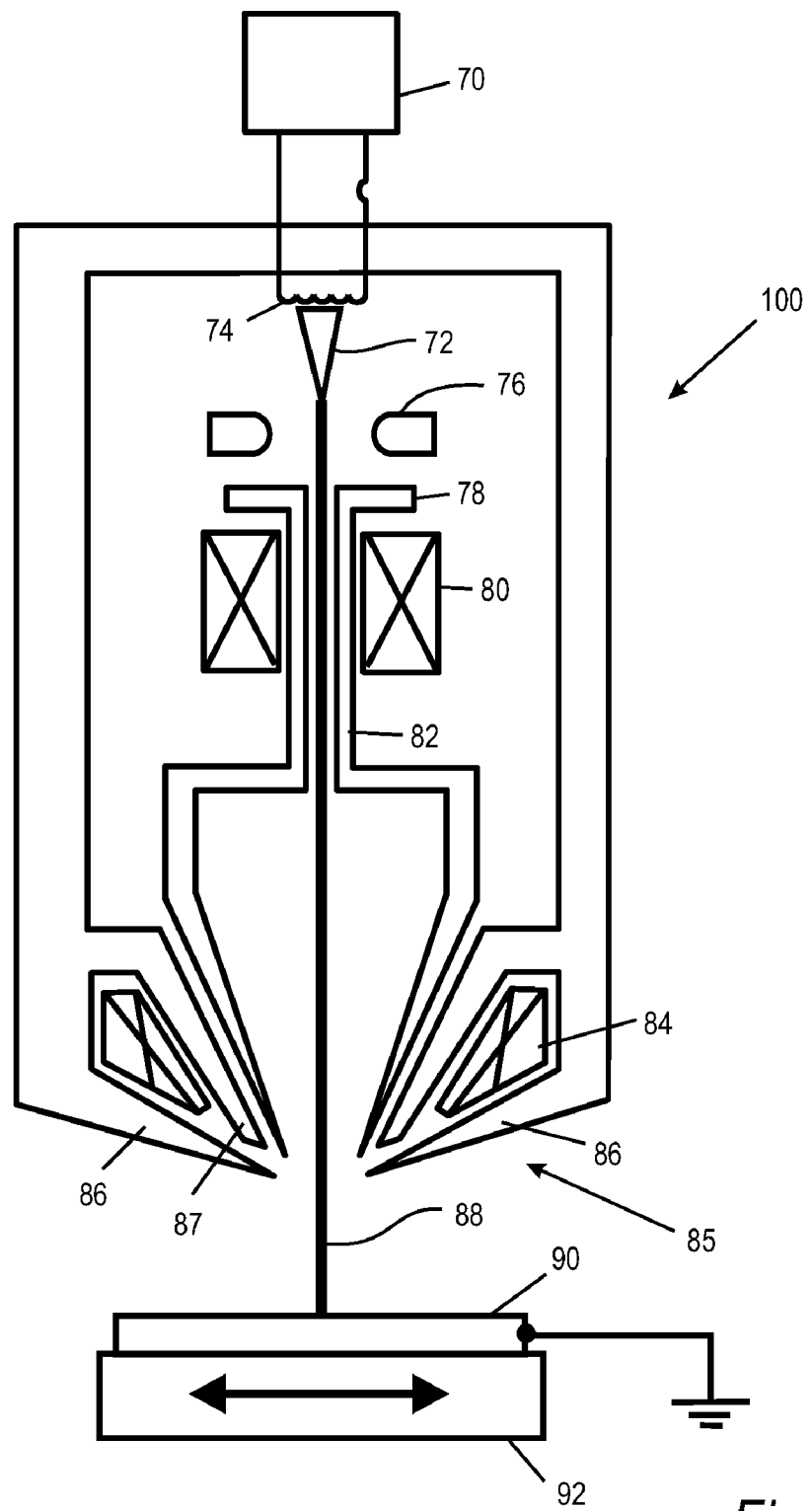
FIG. 5 shows a typical arrangement of a scanning electron microscope.

With reference to FIG. 5 a typical arrangement of a scanning electron microscope 100 is described. The embodiment shown in FIG. 5 has a particle beam source 72 including a heater 74, which is controlled by a controller 70, an emitter surface, an extraction electrode and a suppressor electrode not shown. FIG. 5 is for illustrative purpose and is not drawn to scale.

The electron beam source 72 generates an electron beam 88 which is accelerated by an anode 78 to energy of about 10 keV and guided through a high voltage beam column 82 towards a sample or specimen 90. The high voltage beam column 82 serves to keep the electrons of the electron beam 88 at high energy before their deceleration. The high energy of the electrons during their passage through the beam column helps to minimize diffusion and spreading of the electron beam 88.

In addition to the above mentioned components, the beam column in FIG. 5 comprises a condenser 80 and a final focus lens 85 to focus the electron beam 88 onto the specimen 90. The final focus lens 85 in this embodiment focuses the electron beam by means of a combination of a magnetic field generated by a final focus magnet coil 84, pole pieces 86, 87 and an electric field generated by the voltage applied between specimen 90 and high voltage beam column 82. The high voltage beam column 82 is electrically connected to anode 78 in order to provide an electric field free region for transporting the electron beam 88 towards the specimen 90. In the region between the final focus lens 85 and specimen 90, the electron beam 88 becomes decelerated to a desired final energy at which the specimen is meant to be inspected. A beam blanker or deflector 76 is arranged between particle beam source 72 and specimen 90 for deflecting the particle beam off the specimen surface. The specimen 90 is arranged on a laterally movable stage 90. It is for clarity purposes of the drawings only that the beam optical system illustrated in FIG. 5 shows only some of the components which are usually implemented in a SEM. For example, it does not show apertures, deflectors for scanning the specimen surface or detectors for secondary electrons. However, a skilled person will appreciate that the illustrative SEM of FIG. 5 may include additional components depending on the application of the SEM. The charged particle beam devices were mainly describes as electron beam devices. However, the present application also relates to analogous devices, e.g., ion beam devices.

The invention claimed is:

1. A charged particle beam apparatus comprising:
   an objective lens adapted for focusing a primary charged particle beam on a specimen plane, so that charged particles are emitted from a specimen with a spatial distribution; and
   a charged particle detector assembly for detecting a spatial distribution of charged particles, the charged particle detector assembly comprising:
   a particle detector having at least one particle sensitive region for detecting at least a portion of the spatial distribution of charged particles and for generating a two-dimensional optical signal which correlates to the detected spatial distribution, wherein the particle sensitive region is an essentially singly connected region;
   an image conduit having an input coupled to the particle sensitive region of the particle detector for transmitting the two-dimensional optical signal to at least one optical detector; and
   a selecting means for selecting at least a portion of the two-dimensional optical signal, wherein the particle detector is arranged in front of the specimen with respect to a main propagation direction of the primary charged particle beam.

2. The charged particle beam apparatus according to claim 1, wherein the selecting means is arranged between an output of the image conduit and the at least one optical detector.

3. The charged particle beam apparatus according to claim 1, wherein the selecting means is a variable selecting means for variably selecting portions of the two-dimensional optical signal.

4. The charged particle beam apparatus according to claim 1, wherein the selecting means is configured to select at least one outer portion of the two-dimensional optical signal.

5. The charged particle beam apparatus according to claim 1, wherein the selecting means comprises exchangeable apertures disposed between an output of the image conduit and the optical detector.

6. The charged particle beam apparatus according to claim 1, wherein the selecting means comprises a plurality of optical elements with individually controllable transparency.

7. The charged particle beam apparatus according to claim 1, wherein the selecting means is configured to select at least two portions of the optical signal forming sub-signals from the two-dimensional optical signal and the image conduit is adapted for transmitting each of the at least two sub-signals to a respective separate optical detector.

8. The charged particle beam apparatus according to claim 1, wherein the selecting means comprises a plurality of optical fibers forming a single ordered bundle of optical fibers at one end and at least two separate bundles of optical fibers at the other end.

9. The charged particle beam apparatus according to claim 1, wherein the at least one optical detector comprises the selecting means.

10. The charged particle beam apparatus according to claim 1, wherein the optical detector comprises at least one charged coupled device.

11. The charged particle beam apparatus according to claim 1, wherein the detector comprises at least one photomultiplier.

12. The charged particle beam apparatus according to claim 1, wherein the image conduit is a fiber bundle or a fiber rod.

13. The charged particle beam apparatus according to claim 1, further comprising:
chamber walls defining a vacuum chamber;
a charged particle source for generating a focused primary charged particle beam directed onto the specimen, the interaction of the primary charged particle beam with the specimen resulting in the generation of charged signal particles having the spatial distribution; and
a scanning unit for scanning the focused primary charged particle beam over the specimen.

14. The charged particle beam apparatus according to claim 13, wherein the charged particle beam apparatus has a main optical axis, and in that the particle sensitive region of the particle detector is arranged off-axis with respect to the main optical axis.

15. The charged particle beam apparatus according to claim 13, wherein the particle detector is arranged behind the specimen (2) with respect to a main propagation direction of the primary charged particle beam.

16. The charged particle beam apparatus according to claim 13, wherein the charged particle beam apparatus has a main optical axis, and the particle sensitive region of the particle detector is coaxially arranged with respect to the main optical axis.

17. The charged particle beam apparatus according to claim 13, wherein the objective lens is arranged between the particle detector and the specimen.

18. The charged particle beam apparatus according to claim 1, wherein the image conduit integrally comprises the selecting means.

19. A method for generating an image of a specimen by means of charged particles, the method comprising:
(a) placing the specimen into a vacuum chamber;
(b) scanning a focused primary charged particle beam over a at least a portion of the specimen for generating charged signal particles having a spatial distribution;
(c) detecting at least a portion of the spatial distribution of the charged signal particles, the portion being an essentially singly connected region, and generating a two-dimensional optical signal which correlates to the detected spatial distribution by a particle detector;
(d) selecting a portion of the two-dimensional optical signal;
(e) detecting the selected portion by at least one optical detector; and
(f) generating an image of the specimen using the detected portion of the optical signal.

20. The method according to claim 19, wherein the charged signal particles are secondary charged particles generated upon interaction of the primary charged particles with the specimen, primary charged particles backscattered from the specimen or primary charged particles transmitting the specimen.

21. The method according to claim 19, further comprising the step of:
(c') transmitting the two-dimensional optical signal from the particle detector to at least one optical detector by an image conduit.

22. The method according to claim 19, wherein the step (d) comprises selecting a first portion and a second portion of the two-dimensional optical signal, and wherein the step (c') comprises transmitting the selected first portion of the two-dimensional optical signal to a first optical detector and transmitting the selected second portion of the two-dimensional optical signal to a second optical detector.

* * * * *